United States Patent [19]
Yu et al.

[11] Patent Number: 6,025,272
[45] Date of Patent: Feb. 15, 2000

[54] METHOD OF PLANARIZE AND IMPROVE THE EFFECTIVENESS OF THE STOP LAYER

[75] Inventors: Allen S. Yu, Fremont; Thomas C. Scholer, San Jose; Paul J. Steffan, Elk Grove, all of Calif.

[73] Assignee: Advanced Micro Devices, Inc., Sunnyvale, Calif.

[21] Appl. No.: 09/161,879

[22] Filed: Sep. 28, 1998

[51] Int. Cl.[7] .................................................. H01L 21/00

[52] U.S. Cl. ........................... 438/697; 698/700; 698/740

[58] Field of Search ..................................... 438/697, 698, 438/700, 740

[56] References Cited

U.S. PATENT DOCUMENTS

| | | | |
|---|---|---|---|
| 5,747,381 | 5/1998 | Wu et al. | 438/624 |
| 5,821,160 | 10/1998 | Rodriguea et al. | 438/601 |
| 5,849,637 | 12/1998 | Wang | 438/699 |
| 5,883,004 | 3/1999 | Shiu et al. | 438/692 |

*Primary Examiner*—Benjamin Utech
*Assistant Examiner*—Lynette T. Umez-Eronini
*Attorney, Agent, or Firm*—H. Donald Nelson

[57] ABSTRACT

A method of manufacturing a semiconductor device including a step of filling crevices or non-level regions formed during the manufacture of the semiconductor device with a spin-on dielectric material. The spin-on dielectric material prevents conductive material from filling the crevices and causing the device to fail.

4 Claims, 6 Drawing Sheets

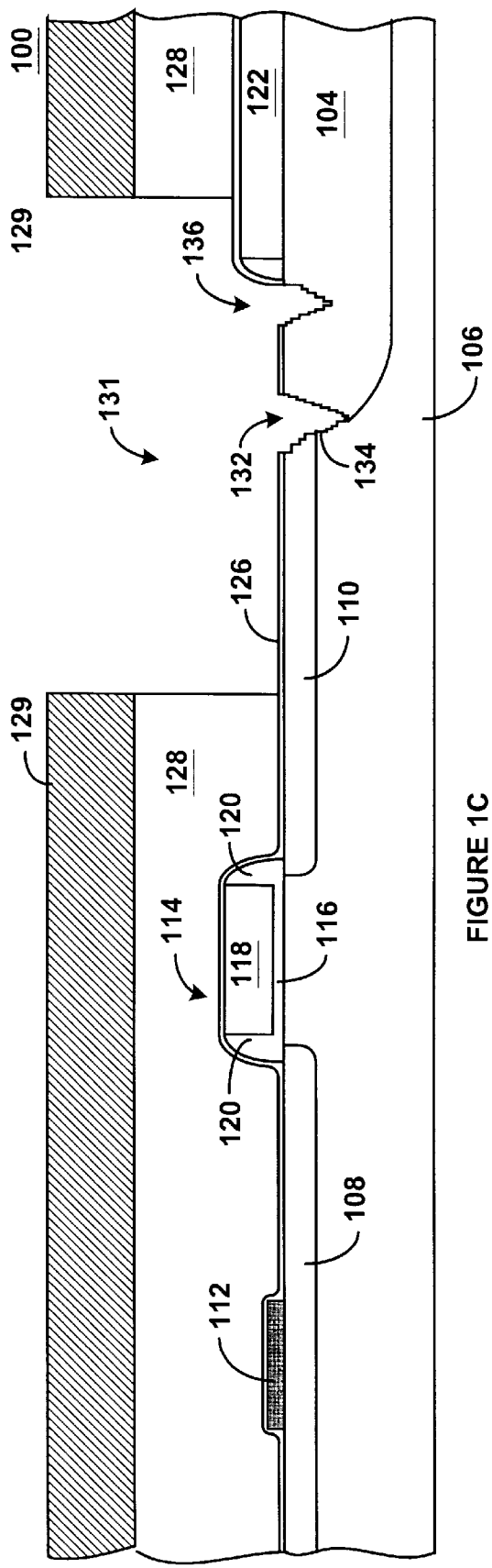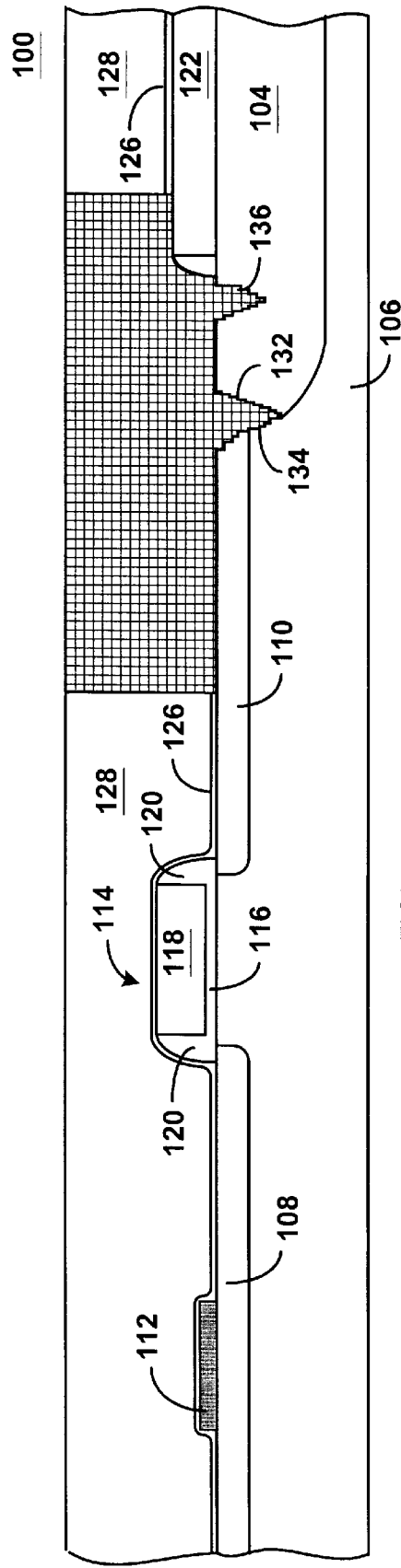
FIGURE 1C
FIGURE 1D

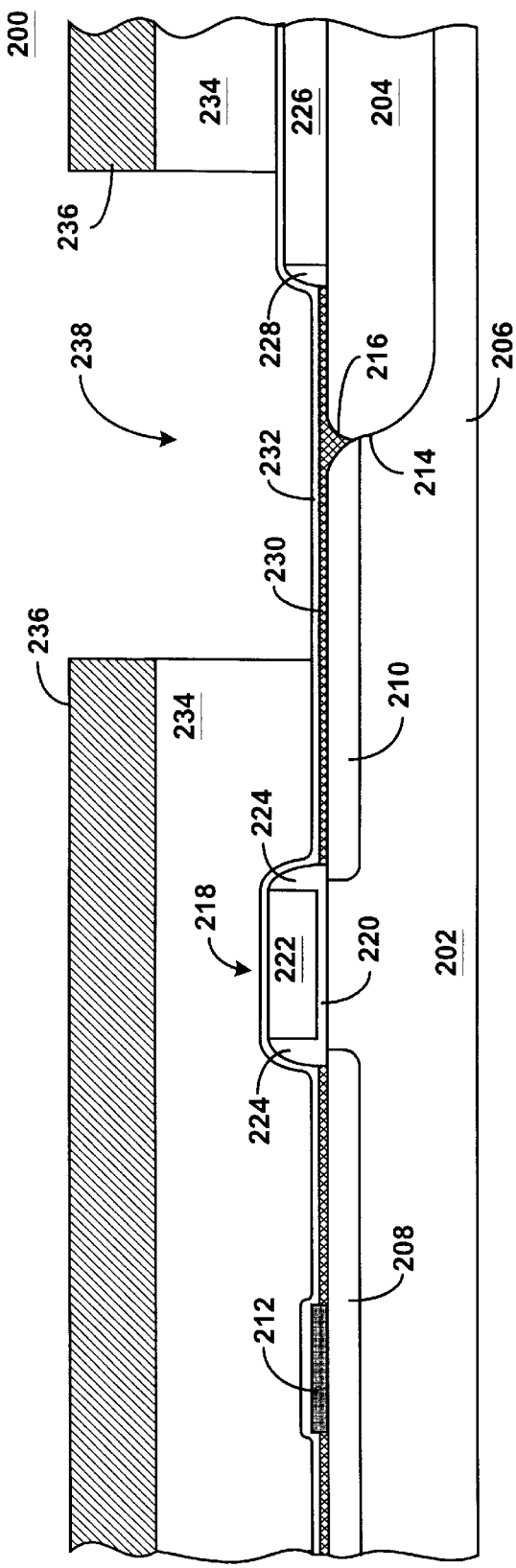
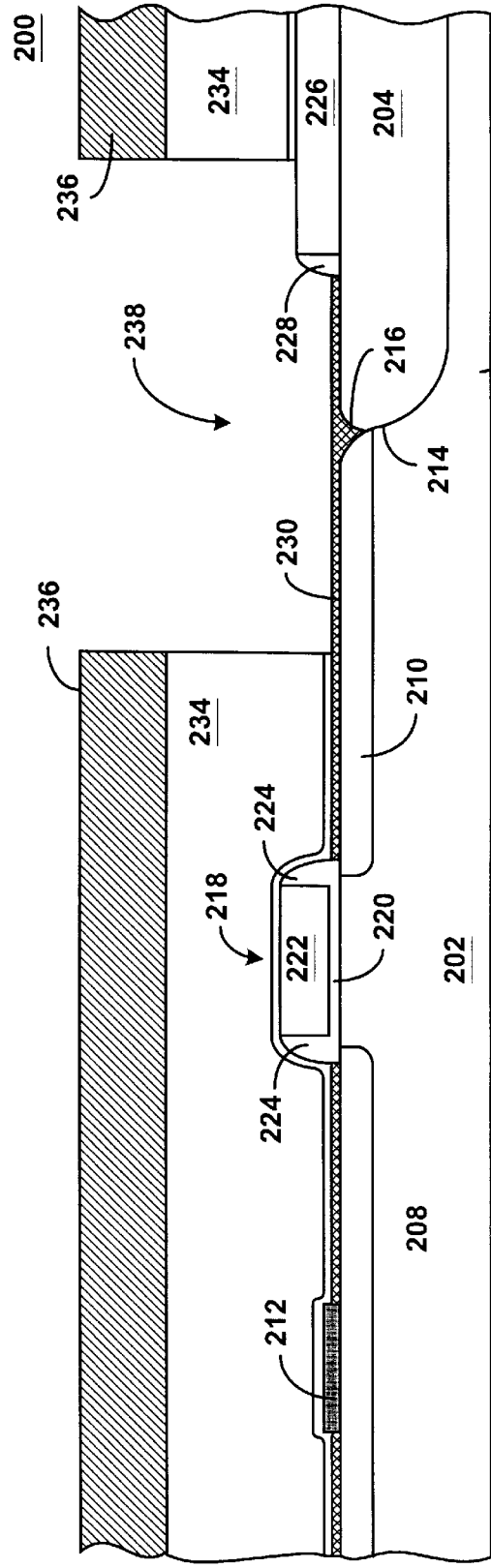
FIGURE 2F
FIGURE 2G

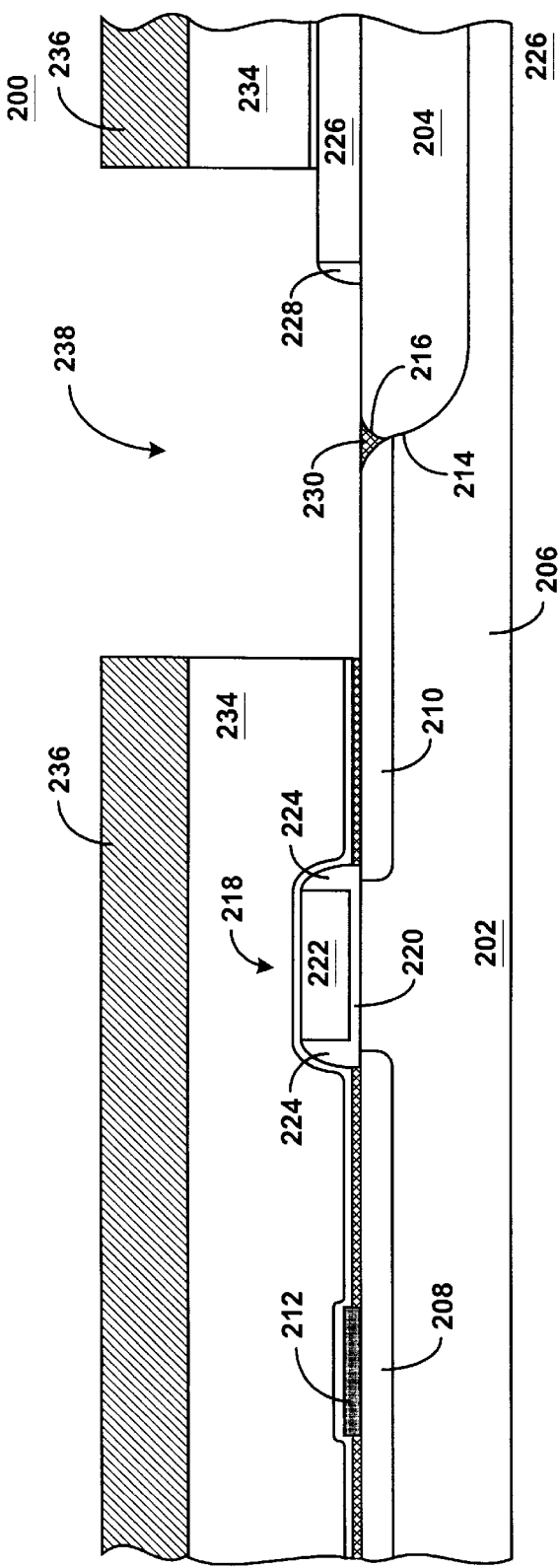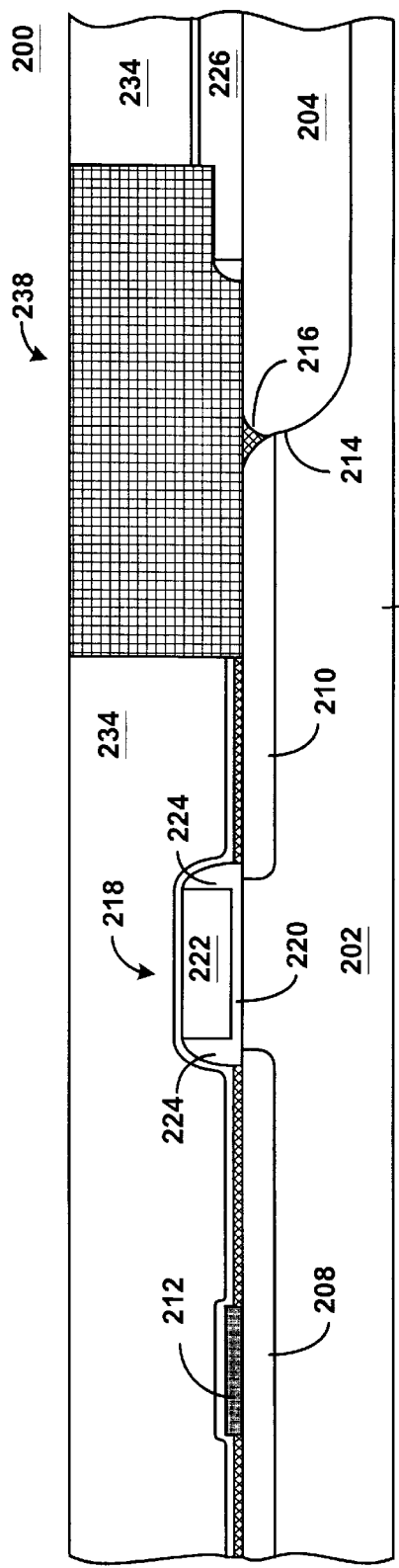

METHOD OF PLANARIZE AND IMPROVE THE EFFECTIVENESS OF THE STOP LAYER

BACKGROUND OF THE INVENTION

1. Field of the Invention

This invention relates generally to a method of manufacturing a high performance semiconductor device. More specifically, this invention relates to a method of manufacturing a high performance semiconductor device including forming a protect film over critical areas of the semiconductor device. Even more specifically, this invention relates to a method of manufacturing a high performance semiconductor device including forming a protect film over critical areas of the semiconductor device using a spin-on film.

2. Discussion of the Related Art

The manufacture of high performance semiconductor devices has, for the most part, devolved into performing certain basic processes to form the semiconductor device. For example, the manufacture of a semiconductor device having MOSFETs is basically a series of processes to form isolation structures such as field oxide (FOX) regions defining active areas in which MOSFETs are to be formed, the formation of the various structures making up the MOSFETs, the formation of a layer of dielectric material (ILD) to electrically separate one active layer of the semiconductor device from another active layer of the semiconductor device, and the formation of electrical interconnections between active components on the same layer (local interconnects) and between active components on different layers (vias).

Although the various manufacturing processes of the basis elements of semiconductor devices are well known, there are problems that decrease the yield of the manufacturing process. One of these problems is that there are critical areas on the semiconductor device that can cause the device to fail if one or more steps in the process are not perfectly executed. FIGS. 1A–1D illustrate one such problem.

FIG. 1A shows a partially completed semiconductor device having a single active area 102 and a single isolation structure 104. It has been found that the junction between the isolation structure 104 and the substrate 106 and region 110 is susceptible to subsequent process steps illustrated in FIGS. 1B–1D. FIG. 1B shows the formation of a layer of dielectric material 128 over etch stop layer 126 that has been formed on the semiconductor device 100. Etch stop layer 126 has several areas that are not flat, indicated at 130 and 132. When the layer of dielectric material 128 is selectively etched, such as at 131, it has been found that the etch process etches through the etch stop layer 126 at those areas of the etch stop layer 126 that are not flat. The etch process etches through the etch stop layer 126 into the underlying material as shown at 125 and 127. The etch process etches the isolation structure 104 material along the junction between the isolation structure 104 and the active area 102 as shown at 132 (FIG. 1C). A subsequent process of filling the area 131 with a conductive material, as shown in FIG. 1D, causes an electrical short between the substrate 106 and the region 110, which could be a drain or source of the MOSFET formed in the active area 102. This electrical short causes the device to fail and decreases the manufacturing yield.

Because current semiconductor devices have thousands, if not many millions of MOSFETs formed on a single device, the failure of any critical area such as one of the junctions as discussed above, will cause the semiconductor device to fail.

Therefore, what is needed is a method of manufacturing semiconductor devices that will decrease the incidence of failure of critical areas of the semiconductor devices.

SUMMARY OF THE INVENTION

According to the present invention, the foregoing and other objects and advantages are attained by forming a spin-on layer of dielectric material on the surface of the semiconductor device. The spin-on layer of dielectric material fills crevices in the semiconductor device that are formed in previous processing steps and prevents the crevices from being filled by conductive material in a subsequent processing step.

In accordance with an aspect of the invention, after isolation structures and active regions are formed in a substrate, the spin-on material is formed on the semiconductor device. Portions of the spin-on material is removed and an etch stop layer and a layer of interlayer dielectric material formed on the semiconductor device. A layer of photoresist is formed on the surface of the interlayer dielectric material and patterned to expose portions of the interlayer dielectric material. The exposed portions of the interlayer dielectric material is etched exposing a portion of the etch stop layer. The exposed portion of the etch stop layer is etched exposing a portion of the spin-on layer of dielectric material. The exposed spin-on layer of dielectric material is etched leaving spin-on material in the crevices. The etched portion of the interlayer dielectric, etch stop layer and spin-on dielectric material is filled with a conductive material.

The described method of manufacturing a semiconductor device provides a method to prevent critical areas of the semiconductor device from being filled with a conductive material and causing the semiconductor device to fail.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

FIG. 1C shows the partially completed semiconductor device shown in FIG. 1B with dielectric material etched;

FIG. 1D shows the partially completed semiconductor device shown in FIG. 1C with a conductive material forming a local interconnect structure;

FIG. 2F shows the partially completed semiconductor device shown in FIG. 2E after an etch process to remove portions of the interlayer dielectric layer;

FIG. 2G shows the partially completed semiconductor device shown n FIG. 2F after an etch process to remove portions of the etch stop layer;

FIG. 2H shows the partially completed semiconductor device shown in FIG. 2G after an etch process to remove portions of the spin-on dielectric layer; and FIG. 2I shows the partially completed semiconductor device shown in FIG. 2H after the etched portions have been filled with a conductive material and the remaining portions of the layer of photoresist have been removed.

DETAILED DESCRIPTION

Reference is now made in detail to specific embodiments of the present invention which illustrate the best mode presently contemplated by the inventors for practicing the invention.

Figure 1A:
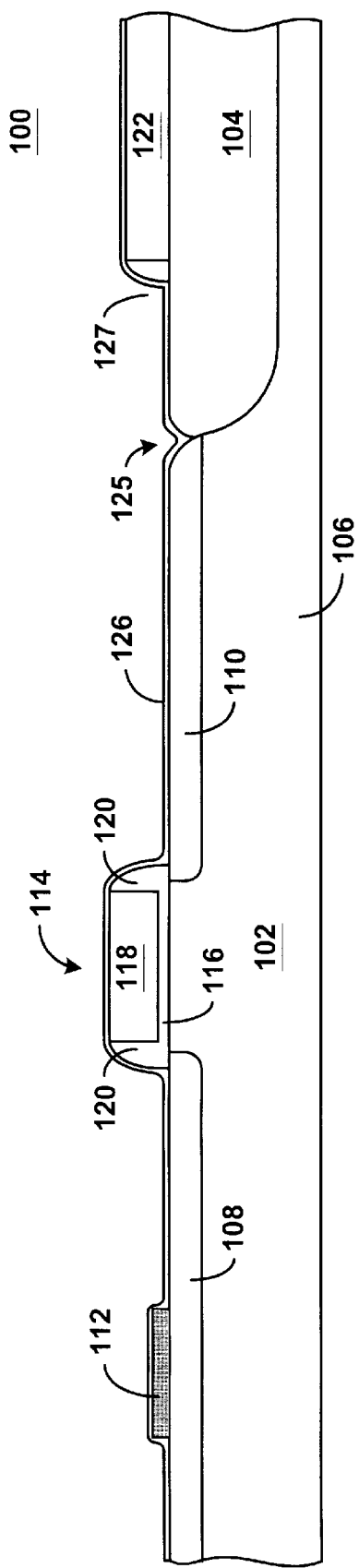
FIG. 1A shows a partially completed semiconductor device as known in the prior art.

FIG. 1A shows a partially completed semiconductor device 100 as known in the prior art. It should be understood that the structure of the semiconductor device 100 shown might vary in obvious ways. For illustrative purposes, the semiconductor device 100 is shown with one active area 102 and one structure 104 that serves to isolate the active area 102 from other active areas (not shown) that would be formed in other regions of the semiconductor device 100. The processes necessary to manufacture the partially completed semiconductor device 100, as shown in FIG. 1A, are well known in the manufacturing art and will not be discussed. The semiconductor device 100 is formed on and in a semiconductor substrate 106, which is typically a lightly doped p− or n− silicon. The active area 102 includes a first region 108 and a second region 110, which are highly doped regions in the substrate 106. The regions 108 and 110 are the source and drain regions of a MOSFET transistor that will be formed in the semiconductor device 100. As is known in the semiconductor art, the highly doped regions in the substrate 106 are "oppositely" doped regions, that is, if the substrate 106 is a p type substrate, the regions 108 and 110 will be highly doped n+ regions and if the substrate 106 is an n type substrate, the regions 108 and 110 will be highly doped p+ regions. A resistor film 112 is shown formed on the surface of region 108. The resistor protect film 112 can be $SiO_2$, SiON, or $Si_xN_y$ and serves to protect the underlying surface from subsequent processes that are performed on the semiconductor device 100. Specifically, one function of the resistor protect film 112 is to prevent silicide from being formed on selected areas of the resistor protect film 112 is to prevent silicide from being formed on selected areas of the active area that underlay the resistor protect film 112. The isolation structure 104 isolates the active region 102 from the electrical field effects of other active regions (not shown) in the semiconductor device 100 and isolates the other active regions from the electrical field effects of the active region 102. The isolation structure 104 is an electrically nonconducting region such as a field oxide (FOX) region or an undoped polysilicon region. A gate structure 114 is formed on the surface of the substrate 106 and defines a channel in the active area 102 between the source and drain regions 108 and 110, respectively. The gate structure 114 includes a gate oxide 116 formed on the surface of the substrate 106 and a gate region 118 formed on the gate oxide 116. The gate structure 114 includes spacers 120 formed on the sides of the gate region 118. The spacers 120 are typically silicon dioxide and are contiguous with the gate oxide 116. The gate region 118 is typically highly doped polysilicon. A conductive region 122 is shown formed on the isolation structure 104. The conductive region 122 can be a conductive metal or doped polysilicon. It is noted that a metallic silicide may be formed on silicon surfaces such as lightly or highly doped silicon and polysilicon surfaces. As is know, metallic silicide will not form on a surface such as silicon dioxide. The metallic silicide is typically titanium silicide, cobalt silicide or a nickel silicide. Etch stop layer 126 is shown formed over the surface of the semiconductor device 100. Etch stop layer 126 is typically a material such as silicon oxynitride and is deposited by chemical vapor deposition (CVD). Thus, etch stop layer 126 has curved surfaces such as those at 125 and 127 because as is known in the semiconductor manufacturing art, a CVD deposited material conforms to the topology of the underlying material.

Figure 1B:
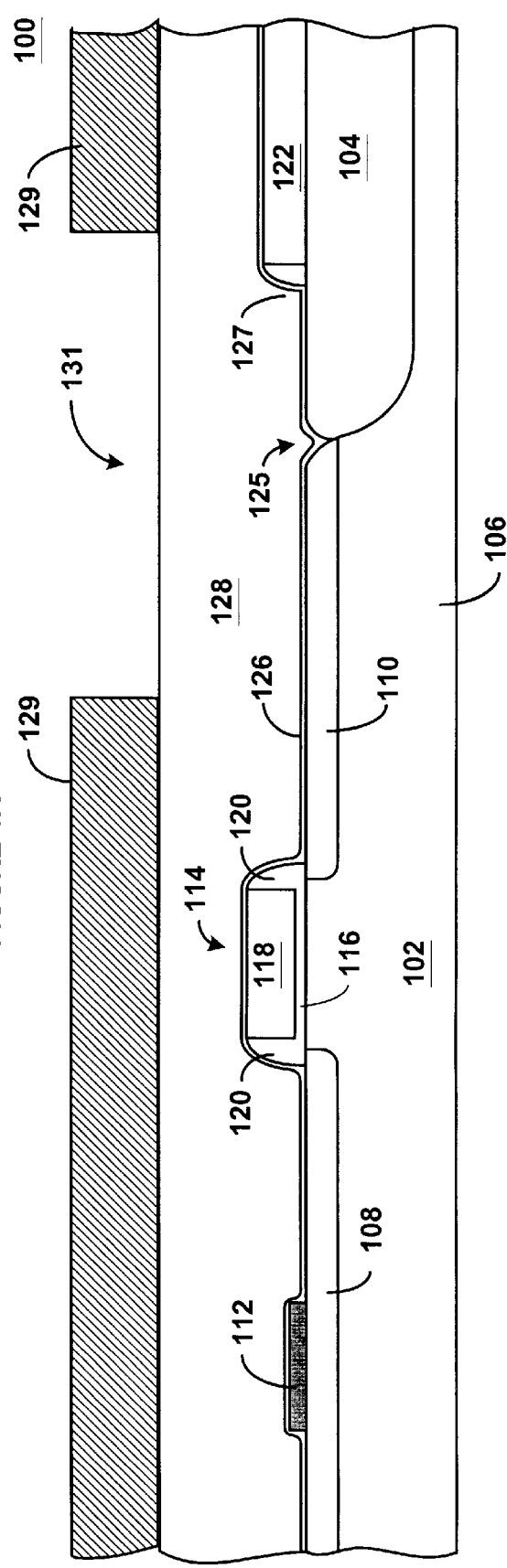
FIG. 1B shows the partially completed semiconductor device shown in FIG. 1A with a layer of dielectric material formed on the surface and a layer of photoresist formed on the layer of dielectric material with the layer of photoresist patterned.

FIG. 1B shows the semiconductor device 100 shown in FIG. 1A with a layer of dielectric material 128 formed on the surface of the semiconductor device 100. The layer of dielectric material 128 is polished by a chemical mechanical planarization (CMP). The layer of dielectric material 128 is typically referred to as an interlayer dielectric (ILD) and serves to electrically isolate one active layer of a semiconductor device from a subsequent active layer of the semiconductor device. The layer of dielectric material 128 is typically silicon dioxide ($SiO_2$). In order to electrically connect selected active devices in one layer to selected active devices in a second or subsequent layer, it is necessary to provide electrical paths from one layer to the next. It is also necessary to provide electrical paths from portions of one active device to portions of another active device on the same layer. The electrical paths connecting one layer to another layer are commonly known as vias and the electrical paths connecting one portion of a first device to a portion of a second device on the same layer are commonly known as local interconnect structures or interconnects. A layer of photoresist 129 is formed on the layer of interlayer dielectric 128 and exposed to form an opening 131 to reveal a portion of the layer of interlayer dielectric 128. FIGS. 1C–1D illustrate the method and structure necessary to electrically connect conductive region 122 to the drain 110. The illustrated method and structure would also be usable as a via to connect the conductive region 122 and the drain 110 to a second or subsequent layer.

FIG. 1C shows the semiconductor device 100 shown in FIG. 1B with a selected portion 131 of the interlayer dielectric 128 removed by a first etch process. The first etch process is designed to only remove the interlayer dielectric 128 material down to the etch stop layer 126. However, it has been found that the first etch process to remove the interlayer dielectric 128 etches through the etch stop layer in certain places and etches material underlying the etch stop layer 126. It has been found that certain location of the etch stop layer 126 are more susceptible of being unable to stop the interlayer dielectric etch process. One such location that is more susceptible to etching are those portions of the etch stop layer 126 that have non-level, vertical or near vertical surfaces. Referring to FIG. 1B there is a non-level surface at 125 and a near vertical surface at 127.

Referring again to FIG. 1C, there is shown an area 132 that was beneath the non-level surface 125, which has been etched. The etched area 132 is shown etched into the isolation structure 104 along the junction between the isolation structure 104 and the highly doped region 110 and along the junction between the isolation structure 104 and the substrate 106. The problem caused by the etched area 132 is that it shorts the highly doped region 110 to the substrate 106 at 134 when the etched area 132 is filled with conductive material in a subsequent process. As can be appreciated by a person of ordinary skill in the semiconductor manufacturing art, the shorting of the highly doped region 110 to the substrate will cause the device to fail. The etched area 138 is shown etched into the isolation structure 104 and will not normally be a problem when the etched area 138 is filled with conductive material in a subsequent process. The etched area 136 is shown etched only into the isolation structure 104. However, because the etched area 136 is entirely within the isolation structure 104 there will not be a resulting problem when the etched area 136 is filled with conductive material in a subsequent process.

FIG. 1D shows the semiconductor device 100 shown in FIG. 1D with the portion of etch stop layer 126 that was exposed by the etched portion 131 of the dielectric layer 128 removed by a second etch process. FIG. 1D also shows the etched portion 131 filled with a conductive material and the remaining portions of the layer of photoresist 129 (FIG. 1C) removed.

FIGS. 2A–2I illustrate a method of manufacturing a semiconductor device in accordance with the present invention.

Figure 2A:
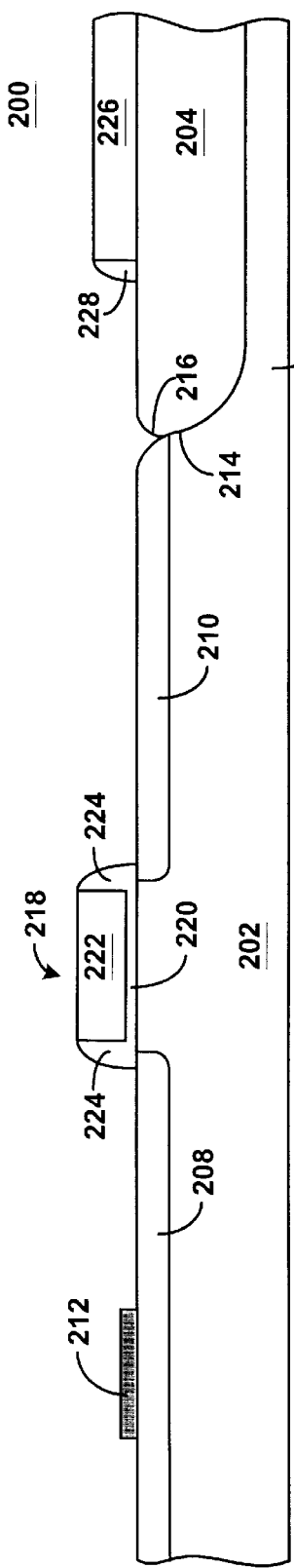
FIG. 2A shows a partially completed semiconductor device in accordance with the present invention.

FIG. 2A shows a partially completed semiconductor device 200 in accordance with the present invention. It should understood that the structure of the semiconductor device 200 may vary in obvious ways. For illustrative purposes, the partially completed semiconductor device 200 is shown with one active area 202 and one structure 204 that serves to isolate the active area 202 from other active areas (not shown) that would be formed n other regions of the semiconductor device 200. The isolation structure 204 as shown is a trench filled with a dielectric material such as silicon dioxide. Another typical structure that is used is a Field Oxide (FOX) region. The processes necessary to manufacture the isolation regions, either a trench region or a FOX region are well known in the art and will not be discussed. In addition, the processes necessary to manufacture the partially completed semiconductor device 200, as shown in FIG. 2A, are well known in the manufacturing art and will not be discussed. The semiconductor device 200 is formed on a semiconductor substrate 206, which is typically lightly doped p– or n– silicon. The active area 202 includes a first region 208 and a second region 210, which are highly doped regions in the substrate 206. The regions 208 and 210 are the source and drain regions of a MOSFET transistor that will be formed in the semiconductor device 200. As is known in the semiconductor art, the highly doped regions in the substrate 206 are "oppositely" doped regions as described above. A resistor protect film 212 is shown formed on the surface of region 208. The resistor film is typically $SiO_2$, SiON or $Si_xN_y$. The resistor protect film 212 serves to prevent silicide from being formed on selected areas of the active area 202 that underlay the resistor protect film 212. The interface region 214 between region 204 and regions 210 and 206 results in a non-level region or crevice at 216. As described above, non-level regions of a surface being subjected to an etch process will be etched even though protected by an etch stop layer. A gate structure 218 is formed on the surface of the substrate 206 and defines the active area 202. The gate structure 218 includes a layer of gate oxide 220 formed on the surface of the substrate 206 and a gate region 222 formed on the layer of gate oxide 220. The gate structure includes spacers 224 formed on the sides of the gate region 222. The spacers 224 are typically silicon dioxide and are contiguous with the layer of gate oxide 220. The gate region 222 is typically highly doped polysilicon. A conductive region 226 is shown formed on the isolation structure 204. The conductive region 226 can be a conductive metal or doped polysilicon. There is also shown a spacer 228 formed on the side of the conductive region 226.

Figure 2B:
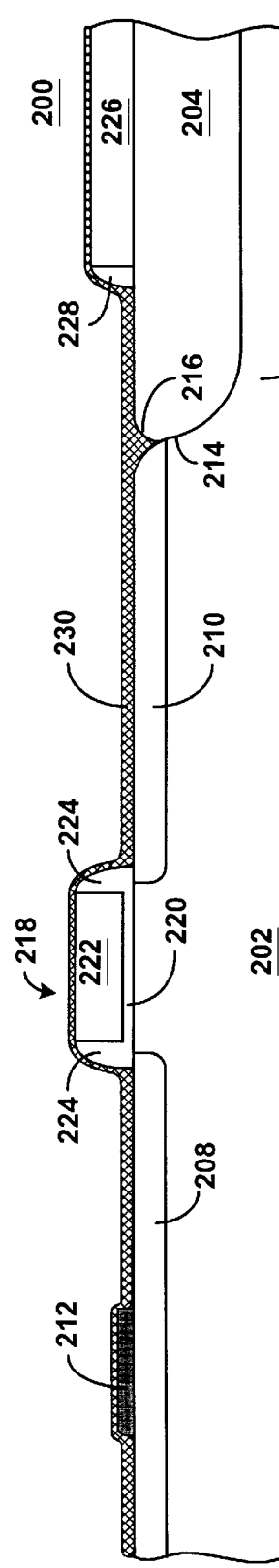
FIG. 2B shows the partially completed semiconductor devices shown in FIG. 2A with a spin-on dielectric layer formed on the surface semiconductor device.

FIG. 2B shows the partially completed semiconductor device 200 shown in FIG. 2A with a spin-on layer 230 of a dielectric material formed on the semiconductor device 200. The spin-on layer 230 can be formed from either a nitride dielectric material or an oxide dielectric material. As is known in the semiconductor manufacturing art, a spin-on material fills any crevices on the surface of the material on which it is being spun onto. In addition, the centrifugal force in the spin-on process causes the surface of the spin-on material to be relatively smooth. It is noted that the non-level region 216 is filled with the spin-on layer material.

Figure 2C:
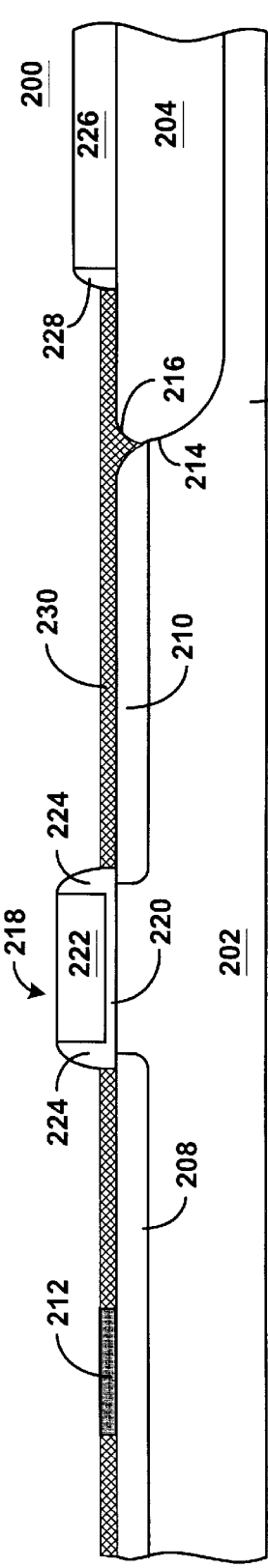
FIG. 2C shows the partially completed semiconductor device shown in FIG. 2B with portions of the spin-on dielectric layer etched.

FIG. 2C shows the partially completed semiconductor device 200 shown in FIG. 2B with portions of the spin-on layer 230 removed. The spin-on layer 230 is shown removed from the top surface of the region 226 and associated spacer 208, the top surface of the gate region 222 and associated spacers 224 and the top surface of layer 212.

Figure 2D:
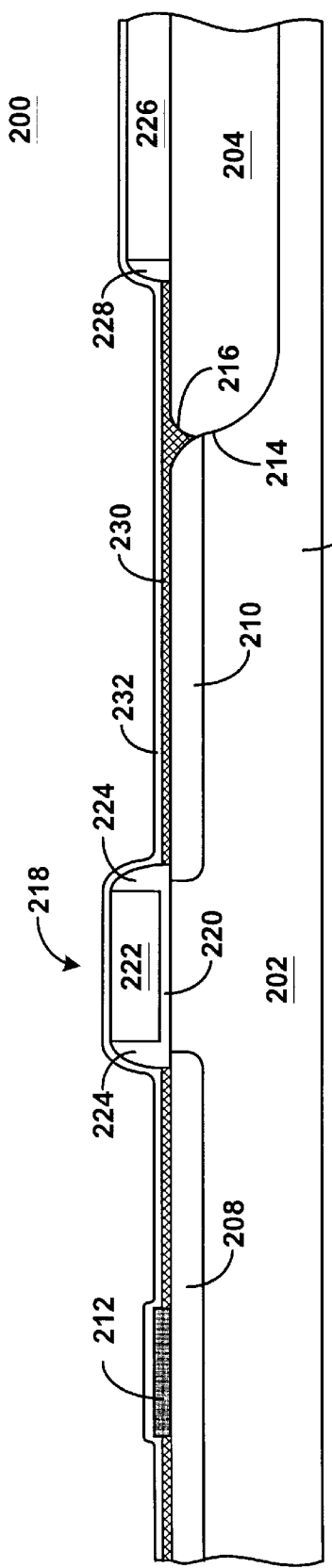
FIG. 2D shows the partially completed semiconductor device shown in FIG. 2C with an etch stop layer formed on the surface of the device shown in FIG. 2C.

FIG. 2D shows the partially completed semiconductor device 200 shown in FIG. 2C with an etch stop layer formed on the surface of the semiconductor device 200. The etch stop layer 232 is typically formed from a material such as silicon oxynitride.

Figure 2E:
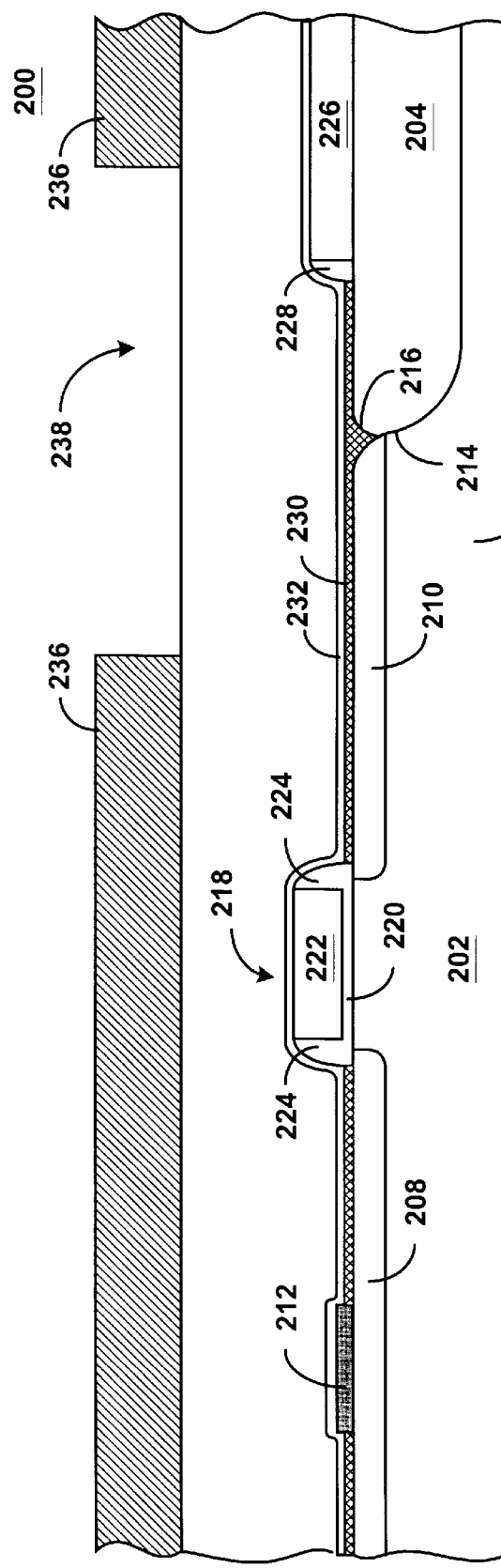
FIG. 2E shows the partially completed semiconductor device shown in FIG. 2D with a layer of interlayer dielectric material and a layer of photoresist formed on the surface of the semiconductor device shown in FIG. 2D.

FIG. 2E shows the partially completed semiconductor device 200 shown in FIG. 2D with a layer 234 of an interlayer dielectric material formed on the surface of the semiconductor device 200. A layer 236 of photoresist is formed on the layer 234 of interlayer dielectric material and is patterned to form an opening 238 in the layer 236 of photoresist to expose a portion of layer 234 of interlayer dielectric material.

FIG. 2F shows the partially completed semiconductor device 200 shown in FIG. 2E after a first anisotropic etch process to remove a portion of the layer 234 of the interlayer dielectric defined by the opening 238.

FIG. 2G shows the partially completed semiconductor device 200 shown in FIG. 2F after a second anisotropic etch process to remove a portion of the etch stop layer 232 defined by the opening 238.

FIG. 2H shows the partially completed semiconductor device 200 shown in FIG. 2G after a third anisotropic etch process to remove the portion of the spin-on layer 230 of dielectric material defined by the opening 238. It is noted that the spin-on layer 230 is not removed from the crevice 216 formed at the interface between the region 204 and the regions 210 and 202.

FIG. 2I shows the partially completed semiconductor device 200 shown in FIG. 2H after the remaining portions of the photoresist layer 236 have been removed and the opening 238 filled with a conductive material. It is noted that the crevice 216 is not filled with the conductive material and thus, will not cause a short to occur between the conductive material in opening 238 and the substrate 206.

In summary, the results and advantages of the method of manufacturing a semiconductor device in accordance with the present invention can now be more fully realized. The step of forming a spin-on dielectric material effectively prevents crevices formed in the semiconductor device in previous processing steps from being filled with conductive material causing the semiconductor device to fail.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device to decrease the incidence of failure of critical areas in the semiconductor device, the method comprising:

forming at least one isolation structure to define at least one active area in a substrate;

forming active elements in the at least one active area in the substrate;

forming a layer of a spin-on layer of a dielectric material over exposed surfaces of the at least one active element, the at least one isolation structure and the substrate, wherein the spin-on layer of dielectric material fills any crevices;

selectively removing portions of the spin-on layer of a dielectric material;

forming an etch stop layer on exposed surfaces of the spin-on layer of a dielectric material, the at least one active element, and the at least one isolation structure;

forming a layer of dielectric material over the etch stop layer; and selectively etching portions of the layer of dielectric material down to the etch stop layer.

2. The method of claim 1 further comprising removing portions of the etch stop layer exposed by the step of selectively etching portions of the layer of dielectric material.

3. The method of claim 2 further comprising removing portions of the spin-on layer of a dielectric material exposed by the step of removing the etch stop layer, wherein the spin-on layer of a dielectric material remains in any crevices.

4. The method of claim 3 further comprising filling the etched portions of the dielectric material, the etch stop layer and the spin-on layer with a conductive material.

* * * * *